United States Patent
Saie

(10) Patent No.: US 8,404,146 B2
(45) Date of Patent: Mar. 26, 2013

(54) POLISHING LIQUID AND POLISHING METHOD

(75) Inventor: Toshiyuki Saie, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 452 days.

(21) Appl. No.: 12/379,331

(22) Filed: Feb. 19, 2009

(65) Prior Publication Data

US 2009/0215270 A1   Aug. 27, 2009

(30) Foreign Application Priority Data

Feb. 26, 2008 (JP) ................................. 2008-043995

(51) Int. Cl.
*C09K 13/06* (2006.01)
(52) U.S. Cl. ......... 252/79.4; 252/79.1; 216/89; 438/692
(58) Field of Classification Search ................... 438/692
See application file for complete search history.

(56) References Cited

U.S. PATENT DOCUMENTS

| | | | |
|---|---|---|---|
| 2002/0139055 A1* | 10/2002 | Asano et al. ..................... | 51/308 |
| 2003/0041526 A1* | 3/2003 | Fujii et al. ....................... | 51/307 |
| 2005/0031789 A1* | 2/2005 | Liu et al. ........................ | 427/340 |
| 2005/0054273 A1 | 3/2005 | Osawa et al. | |
| 2006/0115973 A1* | 6/2006 | Seki et al. ...................... | 438/600 |

FOREIGN PATENT DOCUMENTS

| | | |
|---|---|---|
| JP | A 2000-114213 | 4/2000 |
| JP | A 2000-252242 | 9/2000 |
| JP | A 2004-146840 | 5/2004 |
| JP | 2005-081504 | 3/2005 |
| JP | 2005-158867 | 6/2005 |
| WO | 2007-060869 | 5/2007 |

OTHER PUBLICATIONS

Partial English language translation of the following: Office action dated Nov. 6, 2012 from the Japanese Patent Office in a Japanese patent application corresponding to the instant patent application. This office action translation is submitted now in order to supplement the understanding of patent document JPA 2005-158867, JPA2005-081504 and WO2007/060869 which is cited in the office action and is being disclosed in the instant Information Disclosure Statement.

* cited by examiner

*Primary Examiner* — Lan Vinh
*Assistant Examiner* — Jiong-Ping Lu
(74) *Attorney, Agent, or Firm* — SOLARIS Intellectual Property Group, PLLC

(57) ABSTRACT

A polishing liquid is provided which has good storage stability and is capable of inhibiting generation of scratching caused by aggregation of solid abrasive grains or the like during use. A polishing method using the polishing liquid is also provided. The polishing liquid includes: (a) an aqueous solution A including colloidal silica particles in an amount of from 5 mass % to 40 mass % with respect to the total mass of the aqueous solution A, and having a pH of from 1 to 7; and (b) an aqueous solution B including a quaternary ammonium cation, wherein the aqueous solution A and the aqueous solution B are separately prepared and mixed to provide the polishing liquid immediately before used in polishing.

10 Claims, No Drawings

POLISHING LIQUID AND POLISHING METHOD

CROSS-REFERENCE TO RELATED APPLICATION

This application claims priority under 35 USC 119 from Japanese Patent Application No. 2008-043995, the disclosure of which is incorporated by reference herein.

BACKGROUND OF THE INVENTION

1. Field of the Invention

The present invention relates to a polishing liquid which is used in manufacturing processes for semiconductor devices and a polishing method using the polishing liquid. Specifically, the invention relates to a polishing liquid and a polishing method, which are used for chemical mechanical polishing for planarization in a wiring process for a semiconductor device.

2. Description of the Related Art

In the development of semiconductor devices typically represented by semiconductor integrated circuits such as large scale integrated circuits (hereinafter sometimes referred to as "LSI"), increased density and integration through refining and lamination of wirings has been demanded in recent years in order to decrease the size and increase the operation speed of semiconductor devices. For this purpose, various techniques such as chemical mechanical polishing (hereinafter sometimes referred to as "CMP") have been used. CMP is a technique essential for carrying out surface planarization of a processed film such as an inter-layer insulating film, formation of plugs, formation of buried metal wirings, etc., and this technique is effective for smoothing a substrate, removing excess of a metal thin film, or removing excess of a barrier layer on the insulating film upon wiring formation.

CMP generally involves bonding a polishing pad on a circular polishing platen (platen), dipping the surface of the polishing pad in a polishing liquid, pressing the surface of a substrate (wafer) to the pad, rotating both the polishing platen and the substrate while a predetermined pressure (polishing pressure) is applied from the rear face thereof to planarize the surface of the substrate by generated mechanical friction.

When manufacturing a semiconductor device such as an LSI, fine wirings are formed in a multi-layer component. When forming metal wirings formed from Cu or the like in each of the layers, a barrier metal film formed from Ta, TaN, Ti, TiN, or the like is formed before the formation of metal wirings in view of preventing diffusion of the wiring material to the inter-layer insulating film or improving the adhesion of the wiring material.

In general, in order to form each of the wiring layers, one or more metal layers are subjected to CMP to remove excess wiring material applied by a plating method or the like (hereinafter sometimes referred to as "metal film CMP"), and then a barrier metal material (barrier metal), the surface of which has been exposed by the metal film CMP, is subjected to CMP (hereinafter sometimes referred to as "barrier metal CMP").

The polishing liquid used in CMP generally includes abrasive grains (for example, alumina or silica) and an oxidizing agent (for example, hydrogen peroxide or persulfate). The basic mechanism of CMP is considered to be as follows: the metal surface is first oxidized by an oxidizing agent and the resultant oxide film is removed and polished by abrasive grains.

However, CMP using a polishing liquid including such solid abrasive grains sometimes results in scratching, excessive polishing of the entire surface to be polished (thinning), a phenomenon in which a portion of the polished metal surface is excessively polished whereby a dish-shaped recess is formed on the surface (dishing), a phenomenon in which an insulator placed between metal wirings is excessively polished and only the central portions of plural wiring metal surfaces are deeply polished whereby dish-shaped recesses are formed on the surfaces (erosion), and the like.

The use of a polishing liquid including solid abrasive grains usually involves a complicated cleaning step to remove the polishing liquid remaining on the surface of a semiconductor after polishing. Further, treatment of the liquid (liquid waste) after cleaning is costly due to the need to separate out solid abrasive grains by sedimentation.

Further, since the most of the polishing liquid consists of water, there arise problems, for example, in transportation and storage of a vessel that houses the polishing liquid, and savings in production costs have been demanded.

Various ideas have been proposed for a polishing liquid including solid abrasive grains as described below.

For example, a concentrated polishing liquid and a polishing method using the polishing liquid, which are capable of suppressing erosion and scratching have been proposed (for example, refer to Japanese Patent Application Laid-Open (JP-A) Nos. 2000-252242 and 2004-146840).

However, while the above concentrated polishing liquids address the above problem of transportation or storage of containers, a polishing liquid capable of sufficiently inhibiting scratching caused by aggregation of solid abrasive grains and having good storage stability has not yet been obtained at present.

SUMMARY OF THE INVENTION

According to an aspect of the present invention, a polishing liquid is provided which has good storage stability and is capable of inhibiting generation of scratching caused by aggregation of solid abrasive grains or the like during use.

Further, according to another aspect of the invention, a polishing method using a polishing liquid is provided in which the polishing liquid has good storage stability and is capable of inhibiting generation of scratching caused by aggregation of solid abrasive grains or the like during use.

That is, according to an aspect of the invention, a polishing liquid used for chemical mechanical polishing in planarization of a semiconductor device includes:

an aqueous solution A including colloidal silica particles in an amount of from 5 mass % to 40 mass % with respect to the total mass of the aqueous solution A, and having a pH of from 1 to 7; and an aqueous solution B including a quaternary ammonium cation, wherein the aqueous solution A and the aqueous solution B are prepared separately and subsequently mixed to provide the polishing liquid.

According to another aspect of the invention, a chemical mechanical polishing method includes:

preparing an aqueous solution A including colloidal silica particles in an amount of from 5 mass % to 40 mass % with respect to the total mass of the aqueous solution A, and having a pH of from 1 to 7, and an aqueous solution B including a quaternary ammonium cation;

mixing the aqueous solution A and the aqueous solution B to obtain a polishing liquid;

diluting the polishing liquid with water or an aqueous solution; and polishing a surface while supplying the diluted polishing liquid to a polishing pad on a polishing platen such that the polishing pad contacts the surface, and the polishing pad and the surface move relatively to each other.

DETAILED DESCRIPTION OF THE INVENTION

In the polishing method including mixing (a) an aqueous solution A and (b) an aqueous solution B and diluting the resultant mixture just before polishing, colloidal silica particles and quaternary ammonium cations are separately prepared, whereby the storage stability of a slurry is improved.

Heretofore, a solution including components necessary for a polishing liquid was diluted, as required, with water or the like upon use in polishing. In contrast, according the exemplary embodiment of the invention, colloidal silica particles and quaternary ammonium cations are separately included in an aqueous solution A and an aqueous solution B respectively, which each may include other components, and the aqueous solution A and the aqueous solution B are mixed upon use in polishing to obtain a polishing liquid, and the obtained polishing liquid is optionally diluted with water or the like before being used.

Accordingly, aggregation of components (particularly, abrasive grains) of a polishing liquid may be more inhibited compared to a conventional polishing liquid, by preparing separately components necessary for polishing and mixing the components just before use.

The invention can provide a polishing liquid having good storage stability and capable of suppressing generation of scratching caused by aggregation of solid abrasive grains, etc. during use.

Further, the invention can provide a polishing method using a polishing liquid of good storage stability and capable of suppressing scratching caused by the aggregation of solid abrasive grains, etc. during use.

Hereinafter, exemplary embodiments of the invention will be described in detail.

According to an exemplary embodiment of the invention, a polishing liquid is provided which is used for chemical mechanical polishing (CMP) in a planarization process of a semiconductor integrated circuit or the like. The polishing liquid is obtained by mixing (a) an aqueous solution A including from 5 mass % to 40 mass % of colloidal silica particles with respect to the total mass of the aqueous solution A and having a pH of from 1 to 7, and (b) an aqueous solution B including quaternary ammonium cations.

Meanwhile, according to another exemplary embodiment of the invention, there is provided a set or kit which is used for chemical mechanical polishing in planarizing of a semiconductor integrated circuit, and includes (a) an aqueous solution A including from 5 mass % to 40 mass % of colloidal silica particles with respect to the total mass of the aqueous solution A and having a pH of from 1 to 7, and (b) an aqueous solution B including quaternary ammonium cations.

The polishing liquid of the exemplary embodiment preferably further includes at least one of a corrosion inhibiting agent and an organic acid, whereby anticorrosive performance can be improved or polishing can be carried out without formation of insoluble polishing wastes.

The polishing liquid may further include one or more arbitrary components.

Further, each of the components included in the polishing liquid of the exemplary embodiment may be a single species of component, or two or more species used together as a component.

As used herein, the term "polishing liquid" does not refers to a polishing liquid diluted, as required, before it is used for polishing but a concentrated liquid (concentrated polishing liquid) before the required dilution. The concentrated liquid or the concentrated polishing liquid means a polishing liquid which is prepared to have a higher concentration of a solute than that of a polishing liquid when used for actual polishing. In other words, the concentrated liquid or the concentrated polishing liquid is diluted with water or an aqueous solution before it is used for polishing. The dilution factor is generally from 1 to 20 times by volume. In the present specification, the terms "concentration (concentrated, concentrating)" and "concentrated liquid" are used in accordance with customary expression, but have the meanings "dense" or "dense liquid", and indicate a higher level of concentration than is usually indicated by these terms, and these terms have a different meaning from more general meanings thereof related to physical concentration operations such as evaporation.

Each of the components included in the polishing liquid or the set or kit will be described in detail.

(a) Aqueous Solution A Including from 5 Mass % to 40 Mass % of Colloidal Silica Particles and Having a pH of from 1 to 7

The polishing liquid of the exemplary embodiment includes (a) an aqueous solution A including from 5 mass % to 40 mass % of colloidal silica particles with respect to the total mass of the aqueous solution A and having a pH of from 1 to 7 (hereinafter sometimes referred to as "aqueous solution A").

The colloidal silica used herein may be a colloidal silica obtained by hydrolysis of alkoxysilane which is a raw material not containing impurities such as alkali metals, or a colloidal silica prepared by removing alkalis from an aqueous solution of an alkali silicate. Of these, the colloidal silica obtained by hydrolysis of an alkoxysilane (hereinafter referred to as a sol-gel colloidal silica) is used preferably in a case in which impurities of the alkali metals or the like may adversely affect. In contrast, the colloidal silica prepared from an aqueous solution of an alkali silicate (hereinafter referred to as a water glass colloidal silica) is used preferably from the viewpoint of cost in a case in which the impurities do not adversely affect.

The amount of the colloidal silica particles is from 5 mass % to 40 mass %, more preferably from 5 mass % to 30 mass %, and further preferably from 10 mass % to 30 mass %, with respect to the total mass of the aqueous solution A.

The amount of the colloidal silica particles is preferably from 0.5 mass % to 10 mass %, more preferably from 1 mass % to 10 mass %, and further preferably from 2 mass % to 10 mass %, with respect to the total mass of the polishing liquid after dilution. That is, the amount of the colloidal silica particles is preferably 0.5 mass % or more with respect to the total mass of the polishing liquid from the viewpoint of polishing of the barrier layer at a sufficient polishing rate, and is preferably 10 mass % or less with respect to the total mass of the polishing liquid from the viewpoint of the storage stability.

The diameter of silica particles in the colloidal silica may be selected as appropriate according to the intended application of the abrasive grains, and is generally from about 10 nm to about 200 nm. However, from the viewpoint of preventing scratching, the primary average particle diameter is preferably from 20 nm to 50 nm.

The pH of (a) aqueous solution A is from 1 to 7, preferably from 2 to 5, and further preferably from 2 to 4. By adjusting the pH somewhat lower, the ζ potential of the colloidal silica may be adjusted to a certain range and the storage stability may be ensured.

The pH of (a) aqueous solution A may be adjusted to the range described above by using, as a pH controller, at least one of an alkali, an acid, and a buffer. In the exemplary embodiment, (a) aqueous solution A exerts an excellent effect when it has a pH in the range described above.

Examples of the alkali, acid, and buffer include non-metal alkali agents including organic ammonium hydroxide (such as ammonia, ammonium hydroxide, or tetramethyl ammonium hydroxide), and alkanol amines (such as diethanol amine, triethanol amine, or triisopropanol amine), alkali metal hydroxides such as sodium hydroxide, potassium hydroxide, or lithium hydroxide, inorganic acids such as nitric acid, sulfuric acid, or phosphoric acid, carbonates such as sodium carbonate, phosphates such as trisodium phosphate, borates, tetraborates, and hydroxylbenzoates. Examples of particularly preferred alkali agent include ammonium hydroxide, potassium hydroxide, lithium hydroxide, and tetramethyl ammonium hydroxide.

The polishing liquid of the exemplary embodiment may further include additional abrasive grains other than the colloidal silica particles as long as the additional abrasive grains do not impair the effect of the invention. In this case, the amount (content ratio) of the colloidal silica particles in the entire abrasive grains is preferably 50 mass % or more and particularly preferably 80 mass % or more. Meanwhile, all of the abrasive grains (inorganic particles) to be included may be colloidal silica particles.

Examples of the additional abrasive particles that can be used together with the colloidal silica particles in the polishing liquid of the exemplary embodiment include fumed silica, ceria, alumina, zirconia, and titania. The size of the additional abrasive grains to be used together with the colloidal silica particles is preferably equal to that of the colloidal silica particles or up to twice the size of the colloidal silica particles.

The formulation and properties of (a) aqueous solution A are not particularly limited except for water as the solvent, the amount of the particles, and pH before dilution, and the aqueous solution (A) can also include a surfactant, a high molecular material, or the like as an additive.

(b) Aqueous Solution B Containing Quaternary Ammonium Cation

The polishing liquid of the exemplary embodiment includes (b) an aqueous solution B including a quaternary ammonium cation (hereinafter sometimes referred to optionally as "aqueous solution B").

The quaternary ammonium cation as used herein is not particularly limited as long as it has at least one quaternary nitrogen in the molecular structure thereof.

Particularly, a cation represented by the following formula (I) is preferred from the viewpoint of attaining sufficient improvement of the polishing rate.

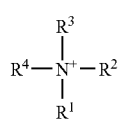

Formula (1)

In Formula (I), $R^1$ to $R^4$ each independently represent an alkyl group having 1 to 20 carbon atoms, an alkenyl group, a cycloalkyl group, an aryl group or an aralkyl group. Any two of $R^1$ to $R^4$ may be bonded with each other to form a ring.

Specific examples of the alkyl group having 1 to 20 carbon atoms represented by each of $R^1$ to $R^4$ include a methyl group, an ethyl group, a propyl group, a butyl group, a pentyl group, a hexyl group, a heptyl group, and an octyl group, and a methyl group, an ethyl group, a propyl group, and a butyl group are preferred among them.

Examples of the alkenyl group represented by each of $R^1$ to $R^4$ include an alkenyl group having 2 to 10 carbon atoms, and specific examples thereof include a vinyl group, a propenyl group, a butenyl group, a pentenyl group, and a hexenyl group.

Specific examples of the cycloalkyl group represented by each of $R^1$ to $R^4$ include a cyclohexyl group and a cyclopentyl group, and a cyclohexyl group is preferred among them.

Specific examples of the aryl group represented by each of $R^1$ to $R^4$ include a phenyl group and a naphthyl group, and a phenyl group is preferred among them.

Specific examples of the aralkyl group represented by each of $R^1$ to $R^4$ include a benzyl group.

Each of the groups represented by each of $R^1$ to $R^4$ may further have a substituent, and examples of the substituent include a hydroxyl group, an amino group, a carboxyl group, a heterocyclic group, a pyridinium group, an aminoalkyl group, a phosphoric acid group, an imino group, a thiol group, a sulfo group, and a nitro group.

In a case where any two of $R^1$ to $R^4$ are bonded with each other to form a ring, examples of the formed ring structure include a pyridine ring.

In the cation represented by Formula (I), it is preferred that $R^1$ to $R^4$ each independently represent an alkyl group having 1 to 5 carbon atoms from the viewpoint of polishing property, and specifically, each independently represent a methyl group, an ethyl group, a propyl group, a butyl group, or a pentyl group. It is particularly preferred that all of $R^1$ to $R^4$ have the same alkyl group.

Specific examples of the cation represented by Formula (I) include a tetramethylammonium cation, a tetraethylammonium cation, a tetrapropylammonium cation, a tetrabutylammonium cation, and a tetrapentylammonium cation.

Specific examples of the cation represented by Formula (I) include the following Exemplary Compounds A1 to A44, but are not limited to them.

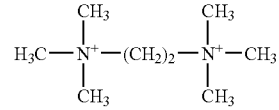

A1

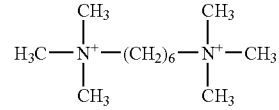

A2

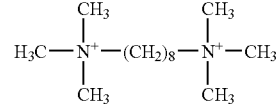

A3

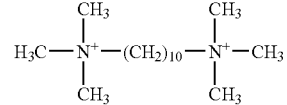

A4

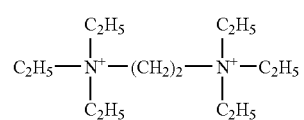 A5
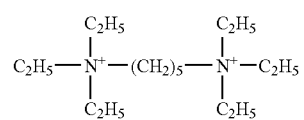 A6
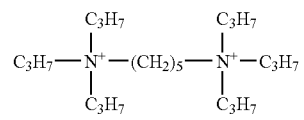 A7
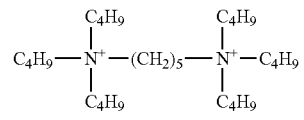 A8
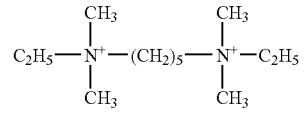 A9
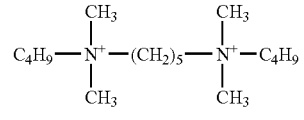 A10
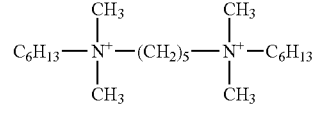 A11
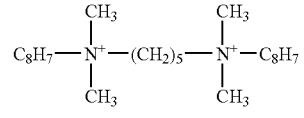 A12
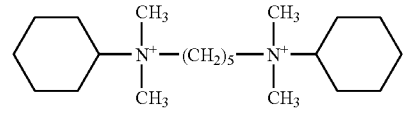 A13
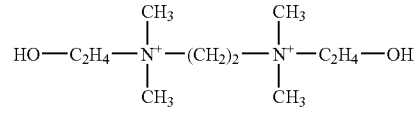 A14
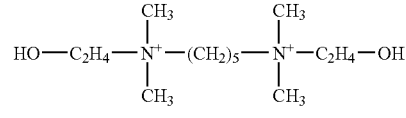 A15
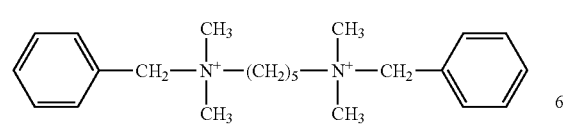 A16
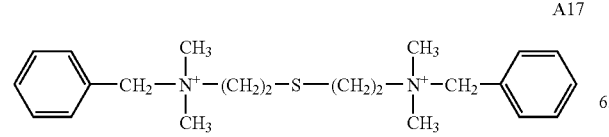 A17
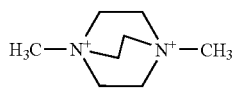 A18
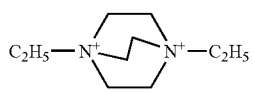 A19
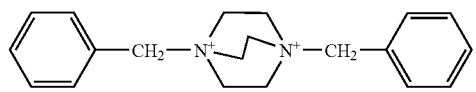 A20
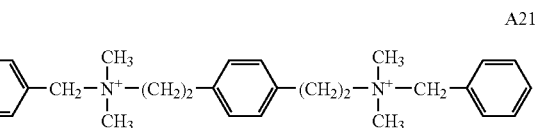 A21
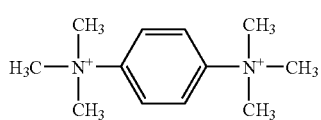 A22
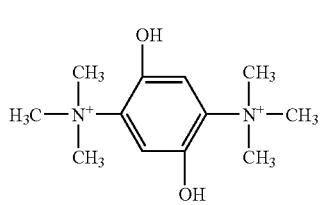 A23
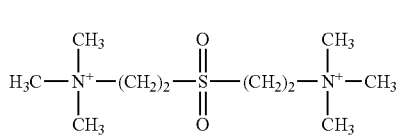 A24
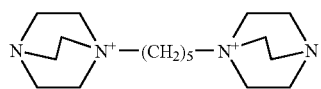 A25
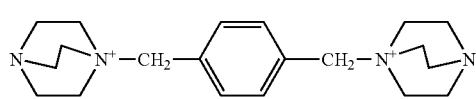 A26
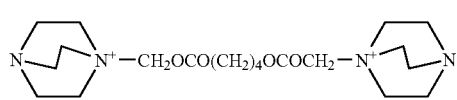 A27
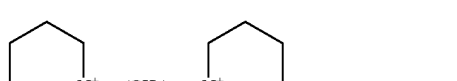 A28
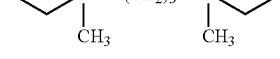 
 A29
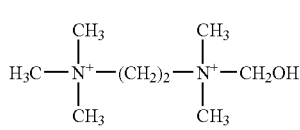 A30

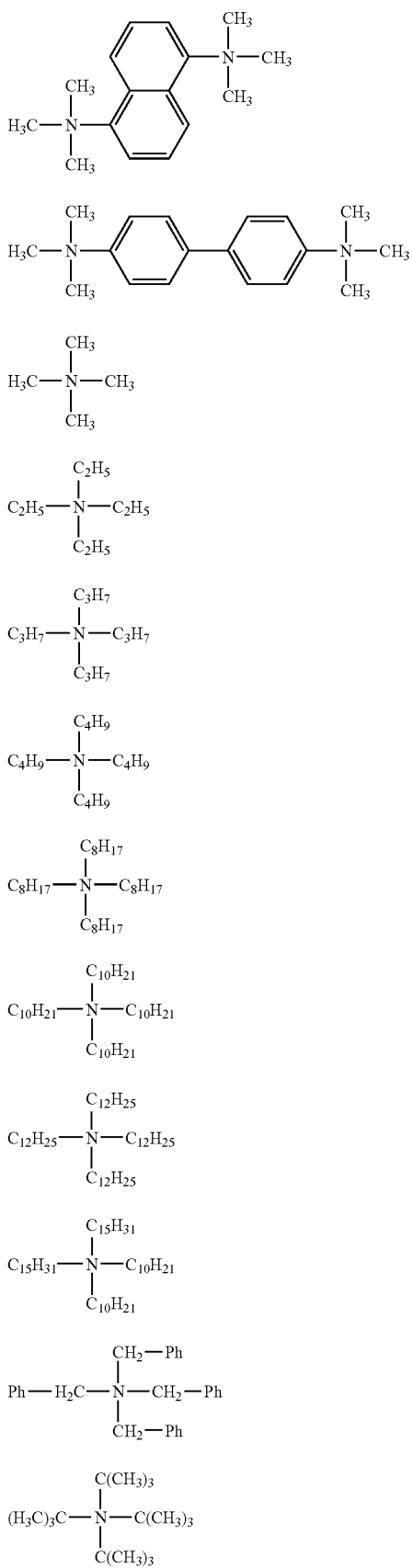

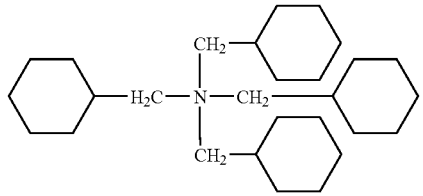

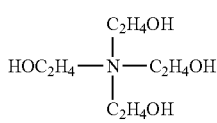

Among the specific examples of the cations represented by Formula (I), Exemplary Compounds A1, A2, A5, A6, A7, A8, A9, A10, A11, A12, A33, A34, A35, A36, A37, A38, A39 and A40 are preferred, and A5, A6, A7, A8, A9, A10, A11, A12, A33, A34, A35, A36, A37, and A38 are more preferred, and A8, A9, A10, A11, A12, A33, A34, and A36 are still more preferred.

The quaternary ammonium cation as used herein can be synthesized, for example, by a substitution reaction in which ammonia or various kinds of amines act as a nucleophilic agent.

Moreover, the quaternary ammonium cation can be purchased as a general commercial reagent.

The amount of the quaternary ammonium cation to be added is preferably from 0.1 mass % to 5 mass %, more preferably from 0.2 mass % to 4 mass %, and further preferably from 0.2 mass % to 2.5 mass %, with respect to the total mass of (b) aqueous solution B.

The amount of the quaternary ammonium cation to be added is preferably from 0.0001 mass % to 1 mass %, and more preferably from 0.001 mass % to 0.3 mass %, with respect to the total mass of the polishing liquid after dilution. That is, the amount of the specific cation is preferably 0.0001 mass % or more from the viewpoint of sufficiently improving the polishing rate and preferably 1 mass % or less from the viewpoint of sufficient stability of a slurry.

Corrosion Inhibiting Agent

The polishing liquid may further include a corrosion inhibiting agent that inhibits corrosion of the metallic surface by adsorbing to the surface to be polished and forming a film thereon. The corrosion inhibiting agent as used in the present invention preferably includes a heteroaromatic ring compound containing at least three nitrogen atoms in the molecule thereof and having a condensed ring structure. The "at least three nitrogen atoms" as used herein are preferably atoms constituting the condensed ring. Examples of the heteroaromatic ring compound include benzotriazole and derivatives thereof obtained by incorporating a substituent group of various kinds into the benzotriazole.

Examples of the corrosion inhibiting agent usable in the invention include compounds selected from the group consisting of benzotriazole, 1,2,3-benzotriazole, 5,6-dimethyl-1,2,3-benzotriazole, 1-(1,2-dicarboxyethyl)benzotriazole, 1-[N,N-bis(hydroxyethyl)aminomethyl]benzotriazole, 1-(hydroxymethyl)benzotriazole, tollyltriazole, 1-(1,2-dicarboxyethyl)tollyltriazole, 1-[N,N-bis(hydroxyethyl)aminomethyl]tollyltriazole, 1-(2,3-dihydroxypropyl)benzotriazole, 1-(2,3-dihydroxypropyl)tollyltriazole, 1-(hydroxymethyl) benzotriazole, tetrazole, 5-aminotetrazole, tetrazol-5-acetic acid, 5-methyltetrazole, and 5-phenyltetrazole. Of these, the compounds selected from the group consisting of 1,2,3-benzotriazole, 5,6-dimethyl-1,2,3-benzotriazole, tollyltriazole, 1-(1,2-dicarboxyethyl)benzotriazole, 1-(1,2-dicarboxyethyl)tollyltriazole, 1-[N,N-bis(hydroxyethyl)aminomethyl]benzotriazole, 1-[N,N-bis(hydroxyethyl)aminomethyl]tollyltriazole, 1-(2,3-dihydroxypropyl)benzotriazole, 1-(2,3-dihydroxypropyl)tollyltriazole, 1-(hydroxymethyl)benzotriazole, tetrazole, 5-aminotetrazole, tetrazole-5-acetic acid, and 5-methyltetrazole.

The amount of the corrosion inhibiting agent to be added is preferably from 0.01 mass % to 0.2 mass %, and more preferably from 0.05 mass % to 0.2 mass %, with respect to the total mass of the polishing liquid after dilution. Specifically, the amount of the corrosion inhibiting agent is preferably 0.01 mass % or more from the viewpoint of preventing expansion of dishing, and is preferably 0.2 mass % or less from the viewpoint of storage stability.

The corrosion inhibiting agent as used in the invention may be included either in the aqueous solution A or in the aqueous solution B. The corrosion inhibiting agent is preferably incorporated in the aqueous solution B from the viewpoint of storage stability.

Organic Acid

The polishing liquid may further include an organic acid.

As the organic acid, a compound having a carboxyl group is preferred. The compound having a carboxyl group is not particularly limited as long as the compound has at least one carboxyl group in a molecule thereof. However, from the viewpoint of polishing rate, the organic acid is preferably a compound represented by the following Formula (I).

The number of the carboxyl group present in the molecule is preferably from 1 to 4, and more preferably from 1 to 2, from the viewpoint of low cost.

$$R^{01}\text{—}O\text{—}R^{02}\text{—}COOH \qquad (i)$$

In Formula (I), $R^{01}$ and $R^{02}$ each independently represent a hydrocarbon group, and preferably a hydrocarbon group having 1 to 10 carbon atoms, provided that the hydrocarbon group represented by $R^{01}$ or $R^{02}$ may contain —O—.

$R^{01}$ represents a monovalent hydrocarbon group, and preferred examples thereof include an alkyl group having 1 to 10 carbon atoms (e.g., a methyl group, or a cycloalkyl group), an aryl group (e.g., a phenyl group), an alkoxy group, and an aryloxy group.

$R^{02}$ represents a bivalent hydrocarbon group, and preferred examples thereof include an alkylene group having 1 to 10 carbon atoms (e.g., a methylene group, or a cycloalkylene group), an arylene group (e.g., a phenylene group), and an alkyleneoxy group.

The hydrocarbon group represented by $R^{01}$ or $R^{02}$ may further have a substituent. Examples of the substituent include an alkyl group having 1 to 3 carbon atoms, an aryl group, an alkoxy group, and a carboxyl group. In a case where the substituent is a carboxyl group, the compound will have a plurality of carboxyl groups.

Further, $R^{01}$ and $R^{02}$ may be bonded with each other to form a ring structure.

Examples of the compound represented by Formula (I) include 2-furancarboxylic acid, 2,5-furandicarboxylic acid, 3-furancarboxylic acid, 2-tetrahydrofurancarboxylic acid, diglycolic acid, methoxyacetic acid, methoxyphenylacetic acid, phenoxyacetic acid, and methyl acetate carboxylic acid. Among them, 2,5-furandicarboxylic acid, 2-tetrahydrofurancarboxylic acid, diglycolic acid, and methoxyacetic acid are preferred from the viewpoint of polishing a surface to be polished at a high speed.

In the polishing liquid, the amount of the organic acid to be added (preferably a compound represented by Formula (i)) is preferably from 0.1 mass % to 5 mass %, and more preferably from 0.5 mass % to 2 mass %, with respect to the total mass of the polishing liquid after dilution. That is, the amount of the organic acid is preferably 0.1 mass % or more from the viewpoint of attaining a sufficient polishing rate, and preferably 5 mass % or less from the viewpoint of not causing excessive dishing.

The organic acid as used in the invention may be incorporated either in the aqueous solution A or the aqueous solution B. The organic acid is preferably incorporated in the aqueous solution B from the viewpoint of controlling pH of the aqueous solution A.

According to an exemplary embodiment of the invention, the polishing liquid is obtained by mixing an aqueous solution A including colloidal silica particles and an aqueous B including a quaternary ammonium cation, an organic acid, a corrosion inhibiting agent, and a surfactant which will be described later. As described above, since the components are included in separate aqueous solutions, aggregation of solid abrasive grains (colloidal silica particles) may be suppressed effectively. As a result, generation of polishing scratches (scratching) due to the aggregation of the solid abrasive grains is suppressed while the obtained polishing liquid has excellent storage stability.

Other Components

In addition to the components described above, the polishing liquid may further include other known components as long as the effect of the invention is not deteriorated.

Surfactants

In the polishing liquid of the invention, surfactants other than nonionic surfactants can be used in combination. Examples of the surfactants that can be used together include anionic surfactants and cationic surfactants.

Specific examples of the anionic surfactant include compounds or salts of decylbenzene sulfonic acid, dodecylbenzene sulfonic acid, tetrabenzene sulfonic acid, hexadecyl benzenesulfonic acid, dodecylnaphthalene sulfonic acid, tetradecyl naphthalene sulfonic acid, or the like.

Specific examples of the cationic surfactant include compounds such as lauryl trimethyl ammonium, lauryl triethyl ammonium, stearyl trimethyl ammonium, palmityl trimethyl ammonium, octyl trimethyl ammonium, dodecyl pyridinium, decyl pyridinium, or octyl pyridinium.

In addition to the compounds or salts of sulfonic acids, examples of the anionic surfactant usable in the invention preferably further include carboxylic acid salts, sulfuric acid ester salts, and phosphoric acid ester salts.

More specifically, preferred examples of the carboxylic acid salt include soap, an n-acylamino acid salt, a polyoxyethylene alkyl ether carboxylate, a polyoxypropylene alkyl ether carboxylate, and an acylated peptide;

preferred examples of the sulfuric acid ester salt include a sulfated oil, an alkyl sulfate, an alkyl ether sulfate, a polyoxyethylene alkylallyl ether sulfate, a polyoxypropylene alkylallyl ether sulfate, and an alkylamide sulfate; and preferred examples of the phosphoric acid ester salt include an alkyl phosphate, a polyoxyethylene alkylallyl ether phosphate, and a polyoxypropylene alkylallyl ether phosphate.

The total amount of the additional surfactant that can be used in combination is preferably from 0.001 to 10 g, more preferably from 0.01 to 5 g, and particularly preferably from 0.01 to 1 g, in 1 L of the polishing liquid after dilution. That is, the amount of the additional surfactant (total amount) is preferably 0.001 g or more in 1 L of the polishing liquid after dilution from the viewpoint of obtaining a sufficient effect, and preferably 10 g or less in 1 L of the polishing liquid after dilution from the viewpoint of preventing lowering of the CMP rate.

In the invention, the surfactant may be incorporated either in the aqueous solution A or in the aqueous solution B. However, the surfactant is preferably incorporated in the aqueous solution B from the viewpoint of storage stability.

Specific examples of the surfactants include the following Exemplary Compounds D1 to D41, but are not particularly limited to them.

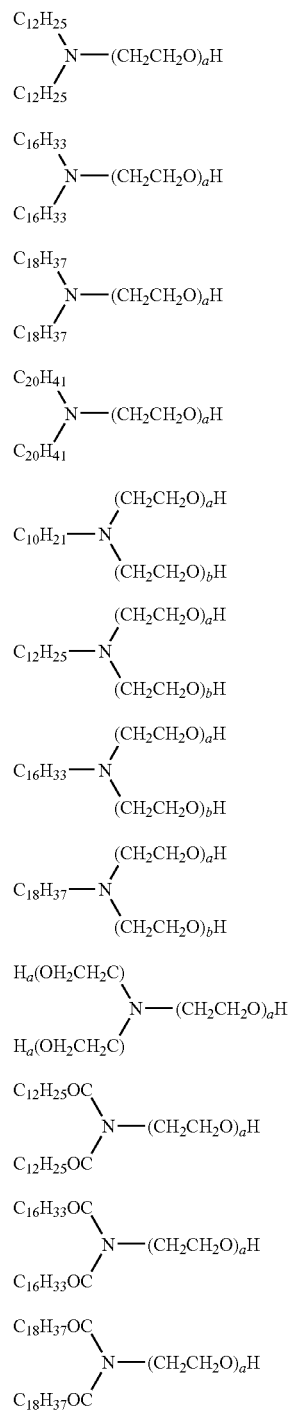

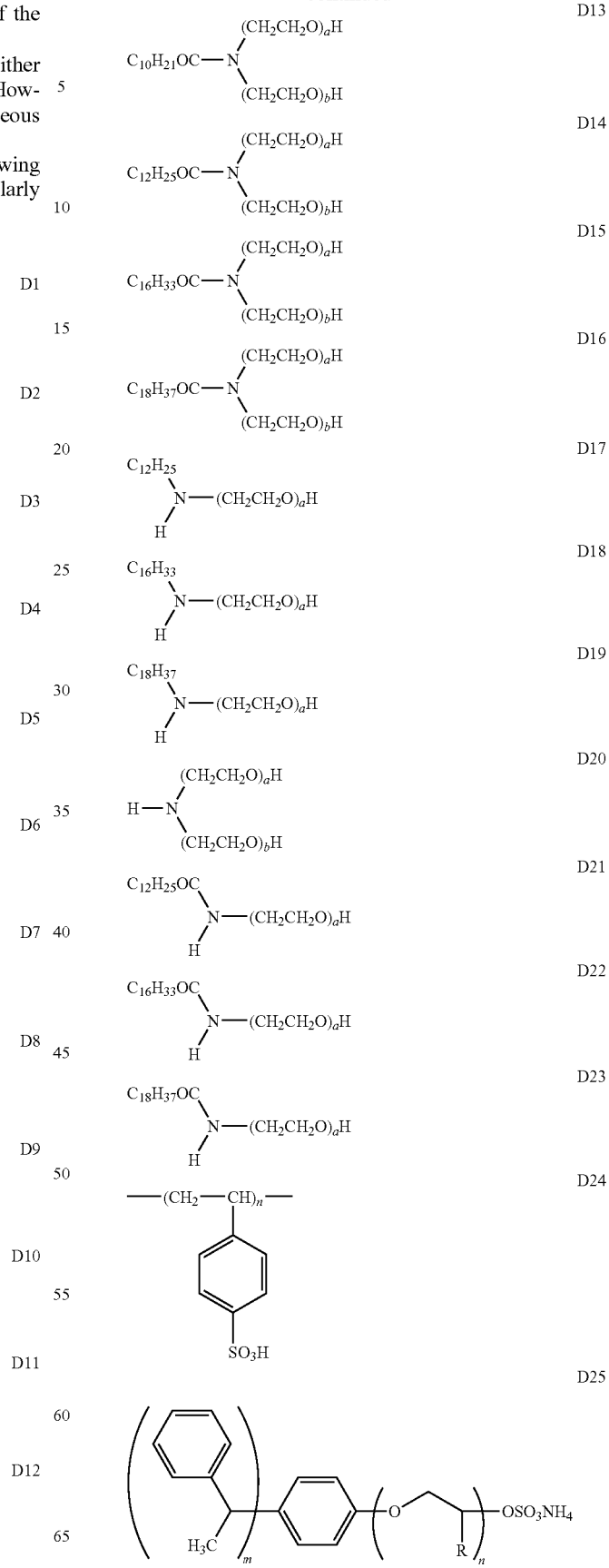

D26 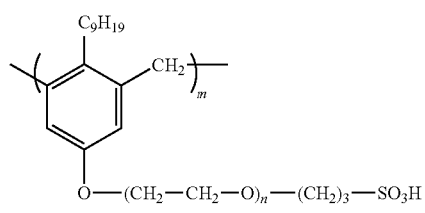
D27 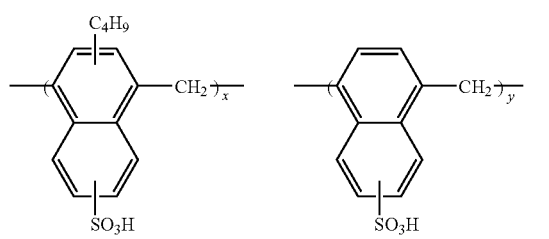
D28 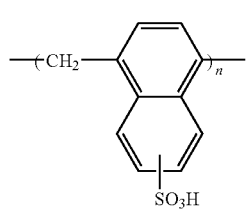
D29 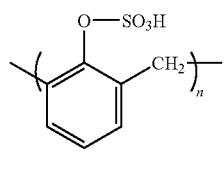
D30 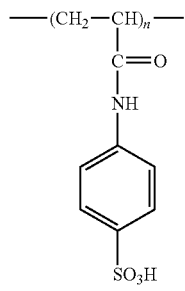
D31 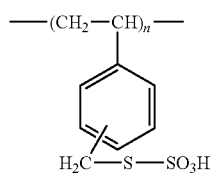
D32 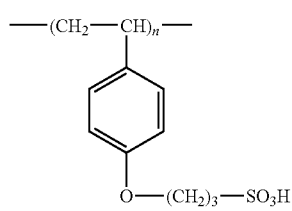
D33 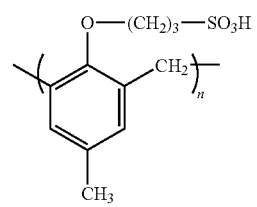
D34 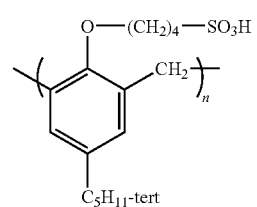
D35 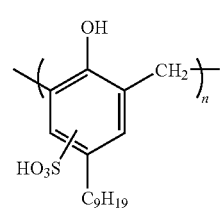
D36 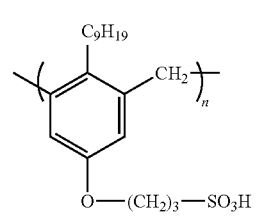
D37 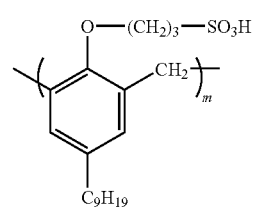
D38 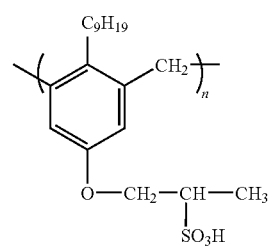
D39 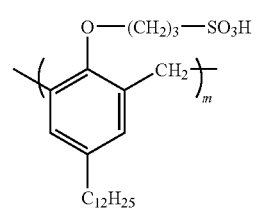

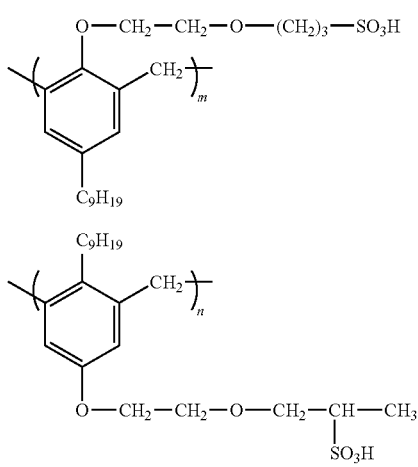

As described above, (b) aqueous solution B includes water as a solvent and a quaternary ammonium cation, and preferably further includes an organic acid and a corrosion inhibiting agent, and has a pH of preferably from 1 to 7, and more preferably from 2 to 5.

The active components which are described later may further be incorporated either in the aqueous solution A or in the aqueous solution B.

Oxidizing Agent

The polishing liquid may further include a compound capable of oxidizing a metal to be polished (oxidizing agent).

Examples of the oxidizing agent include hydrogen peroxide, peroxides, nitrates, iodates, periodates, hypochlorites, chlorites, chlorates, perchlorates, persulfates, bichromates, permanganates, ozone water, silver (II) salts, and iron (III) salts, and among them, hydrogen peroxide is preferably used.

Preferred examples of the iron (III) salts include inorganic iron (III) salts such as iron (III) nitrate, iron (III) chloride, iron (III) sulfate, or iron (III) bromide, and organic complex salts of iron (III).

The amount of the oxidizing agent can be controlled according to the dishing amount present at the time of starting CMP of the barrier metal (barrier metal CMP). If the dishing amount at the time of starting the barrier metal CMP is large, that is, if the wiring material is not to be heavily polished in the barrier CMP, it is preferable to decrease the amount of the oxidizing agent. If the dishing amount is sufficiently small and the wiring material is to be polished at a high speed, it is preferable to increase the amount of the oxidizing agent. As described above, since it is preferable to change the amount of the oxidizing agent in accordance with the degree of dishing at the time of starting the barrier metal CMP, the amount of the oxidizing agent is preferably from 0.01 mol to 1 mol, and particularly preferably from 0.05 mol to 0.6 mol, in 1 L of the polishing liquid after dilution.

pH Controller

The polishing liquid obtained by mixing the aqueous solution A and the aqueous solution B may have a pH of from 1 to 7, preferably of from 2.5 to 5.0, and further preferably of from 3.0 to 4.5.

The polishing rate of the inter-layer insulating film may be controlled more remarkably by controlling the pH of the polishing liquid obtained by mixing the aqueous solution A and the aqueous solution B to fall within the range described above.

For controlling pH in the preferred range described above, at least one of an alkali, an acid, and a buffer may be used. The polishing liquid provides an excellent effect at pH in the range described above.

Examples of the alkali, acid, and buffer include non-metal alkali agents including organic ammonium hydroxides (such as ammonia, ammonium hydroxide, or tetramethyl ammonium hydroxide), and alkanol amines (such as diethanol amine, triethanol amine, or triisopropanol amine), alkali metal hydroxides such as sodium hydroxide, potassium hydroxide, or lithium hydroxide, inorganic acids such as nitric acid, sulfuric acid, or phosphoric acid, carbonates such as sodium carbonate, phosphates such as trisodium phosphate, borates, tetraborates, and hydroxybenzoates. Examples of particularly preferred alkali agent include ammonium hydroxide, potassium hydroxide, lithium hydroxide, and tetramethyl ammonium hydroxide.

The amount of at least one of the alkali, acid, and buffer may be any amount as long as the pH of the polishing liquid is maintained in the preferred range. The amount of at least one of the alkali, acid, and buffer is preferably from 0.0001 mol to 1.0 mol, and more preferably from 0.003 mol to 0.5 mol, in 1 L of the polishing liquid when used for polishing (polishing liquid after dilution).

Chelating Agent

The polishing liquid preferably includes a chelating agent (that is, a hard water softening agent) for decreasing undesired effects of polyvalent metal ions or the like to be intruded.

Examples of the chelating agent include general-purpose hard water softening agents and compounds analogous therewith, which are used as precipitation inhibiting agents for calcium or magnesium. Specific examples thereof include nitrilo triacetic acid, diethylene triamine pentaacetic acid, ethylene diamine tetraacetic acid, N,N,N-trimethylene phosphonic acid, ethylene diamine-N,N,N',N'-tetramethylene sulfonic acid, transcyclohexane diamine tetraacetic acid, 1,2-diaminopropane tetraacetic acid, glycol ether diamine tetraacetic acid, ethylene diamine orthohydroxyphenyl acetic acid, ethylene diamine disuccinic acid (SS form), N-(2-carbolate ethyl)-L-aspartic acid, β-alanine diacetic acid, 2-phosphonobutane-1,2,4-tricarboxylic acid, 1-hydroxyethylidene-1,1-diphosphonic acid, N,N'-bis(2-hydroxybenzyl) ethylene diamine-N,N'-diacetic acid, and 1,2-dihydroxybenzene-4,6-disulfonic acid.

Two or more chelating agents may be used in combination, as required.

It may suffice that the chelating agent is added in such an amount as sufficient to block chelate metal ions, such as polyvalent metal ions, to be intruded. The amount of the chelating agent may be, for example, from 0.0003 mol to 0.07 mol in 1 L of the polishing liquid after dilution.

Object to be Polished

Next, description is to be made to a substrate in which fine wirings which will be polished by the polishing liquid are formed.

The polishing liquid can be used generally for polishing a barrier metal layer formed from a barrier metal material that prevents diffusion of copper, the barrier metal layer being present between wirings formed from copper metal and/or copper alloy and an inter-layer insulating film.

Barrier Metal Material

As the material that forms a barrier layer that is an object to be polished by the polishing liquid, metal materials having low electric resistance are generally preferred. Examples of the material include Ta, TaN, Ti, TiN, Ru, CuMn, $MnO_2$, WN, W, and Co. Among them, Ta and TaN are particularly preferred.

Inter-Layer Insulating Film

Examples of the inter-layer insulating film (insulating layer) as the object to be polished by the polishing liquid include generally-used inter-layer insulating films such as those formed from tetraethoxysilane (TEOS), and inter-layer insulating films containing low-dielectric-constant materials having a specific dielectric constant of, for example, from about 3.5 to about 2.0 (for example, organic polymer materials, and SiOC materials, SiOF materials, which are usually referred to simply as Low-k film).

Specific examples of the materials used for forming the inter-layer insulating film having a low dielectric constant include SiOC materials such as HSG-R7 (manufactured by Hitachi Kasei Industry Co.), and BLACK DIAMOND (manufactured by Applied Materials, Inc.).

In general, such a Low-k film is provided below the TEOS insulating film, and a barrier layer and metal wirings are formed on the TEOS insulating film.

Raw Material for Wiring Metal

A substrate to be polished which is an object to be polished may have wirings which are formed from copper metal and/or copper alloy and may be applied to, for example, semiconductor devices such as LSI. As the raw material for the wiring, copper alloys are particularly preferred. Further, among the copper alloys, copper alloys containing silver are preferred.

The amount of silver included in the copper alloy is preferably 40 mass % or less, more preferably 10 mass % or less, and particularly preferably 1 mass % or less, and a most excellent effect may be obtained when a copper alloy includes silver in an amount of from 0.00001 to 0.1 mass %.

Diameter of Wirings

In the invention, if the substrate, which is an object of polishing, is applied to a dynamic random access memory (DRAM) device, the substrate preferably has wirings having a half pitch of 0.15 μm or less, more preferably 0.10 μm or less, and further preferably 0.08 μm or less.

If the substrate is applied to a micro processing unit (MPU) device, the substrate preferably has wirings having a half pitch of 0.12 μm or less, more preferably 0.09 μm or less, and further preferably 0.07 μm or less.

The polishing liquid exhibits a particularly excellent effect when used for a substrate having wiring configurations such as the above.

Polishing Method

Next, a polishing method in which the polishing liquid of the invention is used is described.

In a polishing liquid of an exemplary embodiment of the invention, each component of the polishing liquid is prepared as an aqueous solution described below, the aqueous solutions are mixed, and the resultant mixture is optionally diluted with water to form a liquid to be used.

The polishing method includes supplying a polishing liquid to a polishing pad on a polishing platen, contacting the liquid with the surface to be polished of the substrate, and moving the surface to be polished and the polishing pad relative to each other.

As a device used for polishing, a general polishing device including a holder that holds a substrate having a surface to be polished (for example, a wafer on which a conductive material film is formed) and a polishing platen bonded with a polishing pad (attached with e.g. a motor having a variable number of rotations) can be used. The polishing pad is not particularly limited, and general non-woven fabrics, foamed polyurethanes, porous fluoro resins, or the like can be used. Further, while the polishing conditions are not particularly limited, the rotation speed of the polishing platen is preferably at a low rotation of 200 rpm or less so that the substrate is not thrown off. The urging pressure of the substrate having the surface to be polished (film to be polished) with respect to the polishing pad is preferably in a range of from 0.68 to 34.5 kPa, and it is more preferably in a range of from 3.40 to 20.7 kPa in order to achieve a desired uniformity of polishing speed in the plane of the substrate, and a desired planarity of the pattern.

During polishing, the polishing liquid is continuously supplied to the polishing pad by a pump and the like.

Once polishing is completed, the polished substrate is washed thoroughly with running water, and then dried by removing the water droplets on the polished substrate with a spin drier or the like.

As an example of a method of diluting a concentrated solution of the polishing liquid of the invention by adding water or an aqueous solution thereto, a pipe that supplies the concentrated polishing liquid, and a pipe that supplies water or an aqueous solution may converge to mix the polishing liquid and the water or aqueous solution, and the resulting diluted polishing liquid as a liquid to be used is then supplied to the polishing pad. Mixing of the concentrated solution and water or aqueous solution can be carried out by, for example, a method of colliding and mixing liquids together by passing them through a narrow channel in a pressurized state, a method of mixing by repetitively separating and joining streams of liquids through the use of stopping elements such as glass tubes or the like provided in a pipe, or a method of disposing a power-rotated vane in the pipe.

The speed of supplying the polishing liquid is preferably in a range of from 10 to 1,000 ml/min, and more preferably in a range of from 170 to 800 ml/min for satisfying the uniformity of the polishing rate in the plane of the substrate and the planarity of the pattern.

Moreover, as another example of the method of polishing while continuing to dilute the concentrated solution with water or an aqueous solution, there is a method in which the pipe for supplying the polishing liquid and the pipe for supplying water or the aqueous solution are separately provided, and predetermined amounts of the liquid and the water or aqueous solution is supplied onto the polishing pad from respective pipes, and polishing is carried out while mixing the liquid and the water or aqueous solution by means of the relative motion between the polishing pad and the surface to be polished. Furthermore, a polishing method may also be employed in which predetermined amounts of the concentrated liquid and the water or aqueous solution are mixed in a single container, and then the mixture is supplied onto the polishing pad.

Moreover, a polishing method may also be used in which the components which must be included in the polishing liquid are divided into at least two constituent components, and the constituent components are diluted, when employed, by adding water or an aqueous solution and supplied onto the polishing pad placed on the surface of the polishing platen, and then brought into contact with the surface to be polished, thereby performing polishing by relatively moving the surface to be polished and the polishing pad.

For example, the components may be divided in such a manner that an oxidizing agent is provided in a constituent component (A), while an organic acid, an additive, a surfactant, and water are provided in a constituent component (B), and at the time of usage, the constituent components (A) and (B) are diluted with water or an aqueous solution.

Alternatively, the additives having low solubility may be separated to be included in either of the two constituent components (A) and (B), for example, in such a manner that the oxidizing agent, additive, and surfactant are provided in the constituent component (A), while the organic acid, additive, surfactant, and water are provided in the constituent component (B), and at the time of usage, the constituent components (A) and (B) are diluted with water or an aqueous solution.

In the case of the exemplary embodiments described above, three pipes that supply the constituent component (A), the constituent component (B), and water or an aqueous solution respectively are necessary. In this case, dilution and mixing may be carried out by a method in which the three pipes are joined into a single pipe for supplying to the polishing pad, and the constituent components and the water or aqueous solution are mixed in the joined pipe. Alternatively, two of the three pipes may be joined first, and the remaining pipe may subsequently be joined further in a downstream direction of the flow of liquid. Specifically, a constituent component including an additive having low solubility and another constituent component may be mixed first, so that the mixing path is lengthened to ensure sufficient time for dissolution, and then subsequently the pipe for supplying water or an aqueous solution may be joined thereto.

Other examples of the mixing method include a method in which the three pipes are directly introduced to the polishing pad and mixing is carried out via a relative motion between the polishing pad and the surface to be polished, and a method in which the three constituent components are mixed in one vessel, and the resultant diluted polishing liquid is then supplied from the vessel to the polishing pad.

In the above-mentioned polishing methods, the temperature of the constituent components may be regulated such that the constituent component including an oxidizing agent has a temperature of 40° C. or less, while other constituent components are heated to a temperature ranging from room temperature to 100° C., and upon mixing these constituent components, or adding water or an aqueous solution for dilution thereto, the resultant solution has a temperature of 40° C. or less. This method is effective for increasing the solubility of a raw material having a low solubility in the polishing liquid, by utilizing a phenomenon whereby solubility is increased by increasing temperature.

The raw materials which are dissolved by heating the other constituent components in a range of from room temperature to 100° C. may precipitate in the solution if the temperature decreases. Therefore, when using the other constituent component when at a low temperature, it is necessary to dissolve the precipitated raw material by heating it in advance. For this purpose, a means to heat the other constituent component to dissolve the raw materials therein and to supply the other constituent component may be used, or a means for stirring a liquid containing precipitates, and sending the liquid through a pipe while heating the pipe to dissolve the precipitates may be used. Since the oxidizing agent may be decomposed by the other heated constituent component when the temperature of the constituent component including the oxidizing agent increases to 40° C. or higher, it is preferable that the temperature is set to 40° C. or lower when the other heated constituent component and the constituent component including the oxidizing agent are mixed.

As described above, according to an exemplary embodiment of the invention, components of the polishing liquid may be divided into two or more portions and supplied to the surface to be polished. In this case, it is preferable that the components are supplied after being divided into a component including the oxidizing agent and a component including the organic acid. Further, the polishing liquid may be prepared as a concentrated solution and supplied separately from diluting water to the surface to be polished.

In the invention, when the method of dividing the components of the polishing liquid into two or more portions and then supplying them to the surface to be polished is employed, the terms "amount of supply" and "supply amount" refer to the total amount of the liquids supplied from respective pipes.

The components which must be included in the polishing liquid are divided into two constituent components, and the constituent components are mixed upon usage. In a specific exemplary embodiment thereof, an aqueous solution A including colloidal silica particles in an amount of from 5 mass % to 40 mass % and having a pH of from 1 to 7 and an aqueous solution B including a quaternary ammonium cation are mixed, and water or an aqueous solution is added thereto, upon use. In this case, the aqueous solution B more preferably includes at least one of an organic acid and a corrosion inhibiting agent.

The method of mixing the aqueous solution A and the aqueous solution B is carried out in such a manner that the aqueous solution A and the aqueous solution B are respectively charged into tanks, the aqueous solution A and the aqueous solution B are poured into a mixing tank from the respective tanks with constant rate pumps, and the aqueous solution A and the aqueous solution B are mixed while adding water thereto and stirring such that the concentration of the abrasive grains is not increased locally. Subsequently, the mixed solution is supplied to the polishing device.

Basically, while mixing of the aqueous solution A and the aqueous solution B is carried out just before polishing, the resultant mixture may be left stand about one day at the maximum before the polishing.

Pad

The polishing pad for polishing applicable to the polishing method of the invention may be a pad formed from a non-foamed body or a pad formed from a foamed body. The pad formed from a non-foamed body may be a rigid synthetic resin bulk material such as a plastic plate. The pad formed from a foamed body may be classified into three: closed cell foam (dry foam system); open cell foam (wet foam system); and a dual layer composite including the closed cell foam and the open cell foam (laminate system). Among them, the dual layer composite body (laminate system) is preferred. Foaming may be uniform or not uniform.

Further, the pad may include abrasive grains used generally for polishing (for example, ceria, silica, alumina, a resin, etc.). Further, the pad may be made of a soft material or a hard material. In a pad of the laminate system, respective layers preferably have different hardnesses. Examples of the material of the pad include non-woven fabric, artificial leather, polyamide, polyurethane, polyester, and polycarbonate. Further, the surface of the pad, which is in contact with the surface to be polished, may be subjected to fabrication of forming at least one of lattice groves, apertures, concentrical grooves, spiral grooves, and the like.

Wafer

The wafer as a substrate which is the object of CMP using the polishing liquid of the invention preferably has a diameter of 200 mm or more, and particularly preferably 300 mm or more. The effect of the invention may be obtained remarkably when the diameter is 300 mm or more.

Polishing Device

The device employing the polishing liquid of the invention in a polishing process is not particularly limited in any manner, and examples thereof include a Mirra Mesa CMP, a Reflexion CMP (both trade names, manufactured by Applied Materials, Inc.), a FREX 200 and a FREX 300 (both trade names, manufactured by Ebara Corporation), an NPS 3301 and an NPS 2301 (both trade names, manufactured by Nikon Corporation), an A-FP-310A and an A-FP-210A (both trade names, manufactured by Tokyo Seimitsu, Co., Ltd.), a 2300 TERES (trade name, manufactured by Lam Research, Co., Ltd.), and a Momentum (trade name, manufactured by Speed-Fam-IPEC, Inc.).

Hereinafter, exemplary embodiments of the present invention are described.

(1) A polishing liquid used for chemical mechanical polishing in planarization of a semiconductor device, including:
an aqueous solution A including colloidal silica particles in an amount of from 5 mass % to 40 mass % with respect to the total mass of the aqueous solution A, and having a pH of from 1 to 7; and
an aqueous solution B including a quaternary ammonium cation,
wherein the aqueous solution A and the aqueous solution B are prepared separately and subsequently mixed to provide the polishing liquid.

(2) The polishing liquid according to (1), wherein the polishing liquid is diluted with water or an aqueous solution before use in polishing.

(3) The polishing liquid according to (1), further including at least one of a corrosion inhibiting agent or an organic acid.

(4) The polishing liquid according to (3), wherein the organic acid is included in the aqueous solution B.

(5) The polishing liquid according to (3), wherein the corrosion inhibiting agent is included in the aqueous solution B.

(6) The polishing liquid according to (1), wherein the quaternary ammonium cation is a cation represented by the following Formula (1):

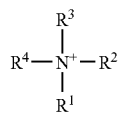

Formula (1)

wherein, in Formula (I), $R^1$ to $R^4$ each independently represent an alkyl group having 1 to 20 carbon atoms, an alkenyl group, a cycloalkyl group, an aryl group or an aralkyl group; and any two of $R^1$ to $R^4$ may be bonded with each other to form a ring.

(7) The polishing liquid according to (1), wherein the amount of the quaternary ammonium cation is from 0.1 mass % to 5 mass % with respect to the total mass of the aqueous solution B.

(8) The polishing liquid according to (2), wherein the amount of the colloidal silica particles is from 0.5 mass % to 10 mass % with respect to the total mass of the polishing liquid after dilution.

(9) The polishing liquid according to (3), wherein the organic acid is a compound represented by the following Formula (I):

$$R^{01}-O-R^{02}-COOH \qquad (i)$$

wherein in Formula (I), $R^{01}$ and $R^{02}$ each independently represent a hydrocarbon group, and the hydrocarbon group represented by $R^{01}$ or $R^{02}$ may contain —O—.

(10) A chemical mechanical polishing method, including:
preparing an aqueous solution A including colloidal silica particles in an amount of from 5 mass % to 40 mass % with respect to the total mass of the aqueous solution A, and having a pH of from 1 to 7, and an aqueous solution B including a quaternary ammonium cation;
mixing the aqueous solution A and the aqueous solution B to obtain a polishing liquid;
diluting the polishing liquid with water or an aqueous solution; and
polishing a surface while supplying the diluted polishing liquid to a polishing pad on a polishing platen such that the polishing pad contacts the surface, and the polishing pad and the surface move relatively to each other.

EXAMPLES

Hereinafter, the present invention will be explained in detail with reference to the following Examples. However, the present invention is not specifically limited to the Examples.

Example 1

An aqueous solution A and an aqueous solution B each having the composition described below were prepared. Upon polishing, the aqueous solution A, the aqueous solution B and water were added and mixed, and the resultant mixture was used as a polishing liquid. The mixing ratio of the aqueous solution A, the aqueous solution B, and water (aqueous solution A:aqueous solution B:water) was 1:1:2.

Composition of Aqueous Solution A
Water
Colloidal silica (amount: 20 mass % with respect to the total mass of aqueous solution A)
The pH of the aqueous solution A was adjusted to 2.0 with aqueous ammonia and nitric acid.

Composition of Aqueous Solution B

| | |
|---|---|
| Quaternary ammonium cation (A1) | 0.8 g/L |
| Organic acid (B-1) | 1 g/L |
| Surfactant (D1) | 0.8 g/L |
| Corrosion inhibiting agent (BTA) | 1 g/L |

Evaluation Method

A device "LGP-612" manufactured by Lapmaster SFT Corp. was used as a polishing device, and each of wafer films described below was polished while a slurry is supplied under the following conditions.

| | |
|---|---|
| Number of rotation of table: | 90 rpm |
| Number of rotation of head: | 85 rpm |
| Polishing pressure: | 13.79 kPa |
| Polishing pad: | Polotexpad |
| | (manufactured by Rodel Nitta Co.) |
| Polishing liquid supplying rate: | 200 ml/min |

Evaluation for Scratching: Object to be Polished

An 8 inch wafer was used as an object to be polished, on which an SiOC film and a TEOS film were formed by a CVD method and were subjected to patterning through a photolithographic process and a reactive ion etching process to form wiring grooves having a width of from 0.09 to 100 μm and a depth of 600 nm and connection holes. A Ta film having a thickness of 20 nm was formed thereon by a sputtering method, a copper film having a thickness of 50 nm was formed thereon by a sputtering method, and a copper film was formed thereon by a plating method to produce a copper film having a total thickness of 1,000 nm.

Evaluation for Scratching

After polishing the copper film of the scratching evaluation polishing object in accordance with the above evaluation method, the Ta film and the TEOS film were polished, and polishing was continued as far as the SiOC film (the SiOC film was polished by 20 nm). After that, the polished surface was cleaned with pure water and dried. The dried polished surface was observed under an optical microscope and scratching thereon was evaluated based on the following evaluation criteria. In the evaluation criteria, "A" and "B" indicate a level of no practical problems. The results are shown in Table 1.

Evaluation Criteria

A: Problematic scratches were not observed.
B: 1 or 2 problematic scratches were observed within the wafer plane.
C: A number of problematic scratches were observed within the wafer plane.

Evaluation of Storage Stability

Scratching was evaluated in the same manner as in the scratching evaluation method described above except that the polishing liquid used was obtained by mixing the aqueous solution A and the aqueous solution B for preparing a polishing liquid, each of which had been stored in an environment of 40° C. for 2 months. Further, scratching was evaluated with respect to a polishing liquid prepared as a single solution just after preparation in the same manner as in the scratching evaluation method described above, and it was used as a reference. Based on the evaluation results of the reference polishing liquid, "A" indicates that an evaluated polishing liquid was comparable to the reference polishing liquid, and "B" indicates that an evaluated polishing liquid was inferior to the reference polishing liquid. The results are shown in Table 1.

Examples 2 to 24

Polishing liquids (polishing liquids of Examples 2 to 24) were prepared in the same manner as in Example 1 except that the components in the formulations of the aqueous solution A and the aqueous solution B in Example 1 were changed to the compounds and the amounts described in Table 1 to Table 3.

Water at mixing ratios described in Table 1 to Table 3 was further added to the obtained polishing liquids of Examples 2 to 24 and a polishing experiment was conducted under the same polishing conditions as those in Example 1.

The results are shown in Table 1 to Table 3.

TABLE 1

| | Aqueous solution A | | | | | Aqueous solution B | | | | Mixing ratio A:B:water | | | | |
| --- | --- | --- | --- | --- | --- | --- | --- | --- | --- | --- | --- | --- | --- | --- |
| | Abrasive grain (amount) | Organic acid (amount) | Surfactant (amount) | Corrosion Inhibiting agent (amount) | pH | Quaternary ammonium cation (amount) | Organic Acid (amount) | Surfactant (amount) | Corrosion Inhibiting agent (amount) | A | B | Water | Storage stability | Scratching property |
| Example 1 | Sol-gel colloidal silica (20 mass %) | | | | 2.0 | A1 (0.8 g/L) | B-1 (1 g/L) | D1 (0.8 g/L) | BTA (1 g/L) | 1 | 1 | 2 | A | A |
| Example 2 | Sol-gel colloidal silica (15 mass %) | | | | 3.2 | A16 (0.2 g/L) | B-1 (1 g/L) | D1 (0.8 g/L) | BTA (1 g/L) DNS (0.5 g/L) | 1 | 3 | 1 | A | A |
| Example 3 | Water glass colloidal silica (30 mass %) | | | | 2.0 | A32 (0.2 g/L) | — | D4 (0.8 g/L) | HMBTA (1 g/L) | 1 | 1 | 0 | A | A |
| Example 4 | Water glass colloidal silica (20 mass %) | | | | 3.0 | A3 (0.4 g/L) | B-1 (1 g/L) | D4 (0.8 g/L) | BTA (1 g/L) LTM (0.5 g/L) | 1 | 1 | 2 | A | A |
| Example 5 | Sol-gel colloidal silica (8 mass %) | | | | 3.8 | A20 (0.2 g/L) | B-3 (1 g/L) | D6 (0.8 g/L) | BTA (1 g/L) DBS (0.5 g/L) | 1 | 1 | 0 | A | A |
| Example 6 | Water glass colloidal silica (40 mass %) | | | | 3.5 | A13 (0.2 g/L) | B-1 (1 g/L) | D7 (0.8 g/L) | HMBTA (1 g/L) | 1 | 1 | 1 | A | A |
| Example 7 | Water glass colloidal silica (30 mass %) | | | | 3.3 | A15 (0.2 g/L) | B-1 (1 g/L) | D8 (0.8 g/L) | DCEBTA (1 g/L) | 1 | 1 | 0 | A | A |
| Example 8 | Sol-gel colloidal silica (5 mass %) | | | | 4.4 | A10 (0.2 g/L) | B-2 (1 g/L) | D9 (0.8 g/L) | BTA (1 g/L) | 1 | 1 | 0 | A | A |

TABLE 2

| | Aqueous solution A | | | | Aqueous solution B | | | | | Mixing ratio A:B:water | | | | Scratch-ing property |
|---|---|---|---|---|---|---|---|---|---|---|---|---|---|---|
| | Abrasive grain (amount) | Organic acid (amount) | Surfactant (amount) | Corrosion Inhibiting agent (amount) | pH | Quaternary ammonium Cation (amount) | Organic Acid (amount) | Surfactant (amount) | Corrosion Inhibiting agent (amount) | A | B | Water | Storage stability | |
| Example 9 | Sol-gel colloidal silica (14 mass %) | | | | 4.8 | A40 (0.2 g/L) | B-1 (1 g/L) | D10 (0.8 g/L) | DBTA (1 g/L) | 3 | 3 | 2 | A | A |
| Example 10 | Water glass colloidal silica (15 mass %) | | | | 3.5 | A9 (0.2 g/L) | B-3 (1 g/L) | D11 (0.8 g/L) | DCEBTA (1 g/L) DBS (0.5 g/L) | 1 | 1 | 1 | A | A |
| Example 11 | Water glass colloidal silica (30 mass %) | | | | 3.8 | A23 (0.2 g/L) | B-1 (1 g/L) | D13 (0.8 g/L) | BTA (1 g/L) DP (0.5 g/L) | 1 | 1 | 1 | A | A |
| Example 12 | Water glass colloidal silica (20 mass %) | | | | 3.5 | A3 (0.2 g/L) | B-2 (1 g/L) | D14 (0.8 g/L) | BTA (1 g/L) | 1 | 2 | 1 | A | A |
| Example 13 | Sol-gel colloidal silica (8 mass %) | | | | 3.5 | A8 (0.2 g/L) | B-1 (1 g/L) | D17 (0.8 g/L) | HEABTA (1 g/L) DP (0.5 g/L) | 1 | 1 | 0 | A | A |
| Example 14 | Water glass colloidal silica (35 mass %) | | | | 3.5 | A14 (0.2 g/L) | B-2 (1 g/L) | D19 (0.8 g/L) | BTA (1 g/L) | 4 | 2 | 1 | A | A |
| Example 15 | Colloidal silica (30 mass %) | | | | 3.5 | A17 (0.2 g/L) | B-2 (1 g/L) | D22 (0.8 g/L) | BTA (1 g/L) | 1 | 2 | 3 | A | A |
| Example 16 | Sol-gel colloidal silica (8 mass %) | | | | 3.5 | A19 (1.2 g/L) | B-1 (1 g/L) | D27 (0.8 g/L) | BTA (1 g/L) | 2 | 2 | 0 | A | A |
| Example 17 | Colloidal silica (15 mass %) | | B-1 (1 g/L) | BTA (1 g/L) DP (0.5 g/L) | 3.0 | A22 (0.8 g/L) | | D28 (0.8 g/L) | | 1 | 1 | 1 | A | B |

TABLE 3

| | Aqueous solution A | | | | | Aqueous solution B | | | | Mixing ratio A:B:water | | | | Scratch-ing property |
|---|---|---|---|---|---|---|---|---|---|---|---|---|---|---|
| | Abrasive grain (amount) | Organic acid (amount) | Surfactant (amount) | Corrosion Inhibiting agent (amount) | pH | Quaternary ammonium Cation (amount) | Organic Acid (amount) | Surfactant (amount) | Corrosion Inhibiting agent (amount) | A | B | Water | Storage stability | |
| Example 18 | Water glass Colloidal silica (35 mass %) | | | | 2.5 | A26 (0.8 g/L) | B-1 (1 g/L) | D31 (0.8 g/L) | BTA (1 g/L) | 3 | 2 | 2 | A | A |
| Example 19 | Water glass Colloidal silica (30 mass %) | | D33 (0.8 g/L) | DBTA (1 g/L) | 3.1 | A28 (0.4 g/L) | B-1 (1 g/L) | | | 1 | 1 | 1 | A | B |
| Example 20 | Colloidal silica (5 mass %) | B-1 (1 g/L) | D36 (0.8 g/L) | | 3.5 | A33 (2.5 g/L) | | | BTA (1 g/L) | 2 | 2 | 1 | A | B |
| Example 21 | Colloidal silica (15 mass %) | | | BTA (1 g/L) | 2.5 | A35 (0.8 g/L) | B-3 (1 g/L) | D38 (0.8 g/L) | | 1 | 1 | 1 | A | B |
| Example 22 | Water glass Colloidal silica (30 mass %) | | | | 3.3 | A36 (1.5 g/L) | B-1 (1 g/L) | D39 (0.8 g/L) | BTA (1 g/L) | 2 | 2 | 1 | A | A |
| Example 23 | Colloidal silica (5 mass %) | | D40 (0.8 g/L) | | 3.1 | A37 (0.2 g/L) | | | BTA (1 g/L) DP (0.5 g/L) | 1 | 1 | 0 | A | B |

TABLE 3-continued

| | Aqueous solution A | | | | | Aqueous solution B | | | | Mixing ratio A:B:water | | | | Scratch- |
|---|---|---|---|---|---|---|---|---|---|---|---|---|---|---|
| | Abrasive | Organic | | Corrosion Inhibiting | | Quaternary ammonium | Organic | | Corrosion Inhibiting | | | | | |
| | grain (amount) | acid (amount) | Surfactant (amount) | agent (amount) | pH | Cation (amount) | Acid (amount) | Surfactant (amount) | agent (amount) | A | B | Water | Storage stability | ing property |
| Example 24 | Colloidal silica (15 mass %) | | B-2 (1 g/L) | | 4.4 | A38 (0.1 g/L) | | D41 (0.8 g/L) | BTA (1 g/L) | 2 | 2 | 1 | A | B |

The quaternary ammonium ions A1 to A40 shown in Tables 1 to 3 indicate the exemplary compounds described as the specific examples of the cations represented by Formula (1).

The organic acids described in Tables 1 to 3 are shown in Table 4 below.

The surfactants D1 to D41 shown in Tables 1 to 3 indicate the exemplary compounds described as the specific examples of the surfactants described above.

TABLE 4

| | Compounds |
|---|---|
| B-1 | Diglycolic acid |
| B-2 | 2,5-frandicarboxylic acid |
| B-3 | 2-tetrahydrofurancarboxylic acid |

Details of the compounds abbreviated in Table 1 are shown below.
BTA=1,2,3-benzotriazole
HMBTA=1-(hydroxymethyl)benzotriazole
DCEBTA=1-(1,2-dicarboxyethyl)benzotriazole
DBTA=5,6-dimethyl-1,2,3-benzotriazole
HEABTA=1-[N,N-bis(hydroxyethyl)aminomethyl]benzotriazole
DNS: Dodecylnaphthalene sulfonic acid
LTM: Lauryl trimethyl ammonium nitrate
DP: Dodecyl pyridinium nitrate
DBS: Dodecylbenzene sulfonic acid As shown in Tables 1 to 3, the polishing liquids of Examples 1 to 24 are excellent in storage stability and scratching property.

What is claimed is:

1. A polishing liquid set used for chemical mechanical polishing in planarization of a semiconductor device, consisting of:
   an aqueous solution A consisting of water and colloidal silica particles in an amount of from 5 mass % to 40 mass % with respect to the total mass of the aqueous solution A, and having a pH of from 1 to 7; and
   an aqueous solution B consisting of a quaternary ammonium cation, an organic acid, a surfactant, a corrosion inhibiting agent, and water,
   wherein the aqueous solution A and the aqueous solution B are separate aqueous solutions.

2. The polishing liquid set according to claim 1, wherein the surfactant comprises an anionic surfactant.

3. The polishing liquid set according to claim 2, wherein the anionic surfactant comprises at least one selected from the group consisting of a sulfonic acid salt, a carboxylic acid salt, a sulfuric acid ester salt, and a phosphoric acid ester salt.

4. The polishing liquid set according to claim 1, wherein the surfactant comprises a cationic surfactant.

5. A polishing liquid set used for chemical mechanical polishing in planarization of a semiconductor device, consisting of:
   an aqueous solution A consisting of water and colloidal silica particles in an amount of from 5 mass % to 40 mass % with respect to the total mass of the aqueous solution A, and having a pH of from 1 to 7; and
   an aqueous solution B consisting of a quaternary ammonium cation, an organic acid, a corrosion inhibiting agent, and water,
   wherein the aqueous solution A and the aqueous solution B are separate aqueous solutions.

6. A polishing liquid set used for chemical mechanical polishing in planarization of a semiconductor device, consisting of:
   an aqueous solution A consisting of water, a pH controller, colloidal silica particles in an amount of from 5 mass % to 40 mass % with respect to the total mass of the aqueous solution A, and having a pH of from 1 to 7; and
   an aqueous solution B consisting of a quaternary ammonium cation, an organic acid, a surfactant, a corrosion inhibiting agent, and water,
   wherein the aqueous solution A and the aqueous solution B are separate aqueous solutions.

7. The polishing liquid set according to claim 6, wherein the surfactant comprises an anionic surfactant.

8. The polishing liquid set according to claim 7, wherein the anionic surfactant comprises at least one selected from the group consisting of a sulfonic acid salt, a carboxylic acid salt, a sulfuric acid ester salt, and a phosphoric acid ester salt.

9. The polishing liquid set according to claim 6, wherein the surfactant comprises a cationic surfactant.

10. A polishing liquid set used for chemical mechanical polishing in planarization of a semiconductor device, consisting of:
    an aqueous solution A consisting of water, a pH controller, colloidal silica particles in an amount of from 5 mass % to 40 mass % with respect to the total mass of the aqueous solution A, and having a pH of from 1 to 7; and
    an aqueous solution B consisting of a quaternary ammonium cation, an organic acid, a corrosion inhibiting agent, and water,
    wherein the aqueous solution A and the aqueous solution B are separate aqueous solutions.

* * * * *